United States Patent
Hsuan

(10) Patent No.: US 7,450,150 B2
(45) Date of Patent: Nov. 11, 2008

(54) INTEGRATED AUDIO/VIDEO SENSOR

(75) Inventor: Min-Chih Hsuan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 919 days.

(21) Appl. No.: 10/700,785

(22) Filed: Nov. 3, 2003

(65) Prior Publication Data

US 2005/0088517 A1 Apr. 28, 2005

(30) Foreign Application Priority Data

Oct. 22, 2003 (TW) .............................. 92129226 A

(51) Int. Cl.
*H04N 7/18* (2006.01)
*H04N 9/47* (2006.01)

(52) U.S. Cl. ........................................................ 348/61
(58) Field of Classification Search ....................... None
See application file for complete search history.

(56) References Cited

U.S. PATENT DOCUMENTS

| 2002/0133566 A1* | 9/2002 | Teeple | 709/218 |
| 2004/0260669 A1* | 12/2004 | Fernandez | 707/1 |
| 2005/0125083 A1* | 6/2005 | Kiko | 700/19 |

* cited by examiner

Primary Examiner—Nhon T Diep
(74) Attorney, Agent, or Firm—J.C. Patents

(57) ABSTRACT

An integrated audio/video sensor is provided. The integrated sensor comprises an image-receiving module for sensing a light of an image, a sound-receiving module for sensing a sound and a signal-transforming module for integrating image and sound signals into an audio/video signal. The integrated sensor integrates image and sound together simultaneously and synchronously. Furthermore, the integrated sensor can be connected directly to an image-processing system. The integrated sensor not only provides excellent synchronization of audio and video signals, but also reduces the size and cost of producing the integrated sensor as well.

17 Claims, 3 Drawing Sheets

INTEGRATED AUDIO/VIDEO SENSOR

CROSS-REFERENCE TO RELATED APPLICATION

This application claims the priority benefit of Taiwan application serial no. 92129226, filed on Oct. 22, 2003.

BACKGROUND OF THE INVENTION

1. Field of the Invention

The present invention relates to an audio and video sensing device. More particularly, the present invention relates to a compact and inexpensive integrated audio/video sensor and system capable of receiving image and sound signals synchronously and resolving image/sound sensing circuit compatibility problem.

2. Description of the Related Art

In modern society, consumer electronics products play an increasing important role in our daily life. To be popular, these electronic products must be light and compact, have a low operating voltage and consume as little power as possible. In recent years, most consumer products are aiming for portability. In other words, inventors are seeking ways to integrate formerly individual devices into a smaller unit so that the integrated product is rendered lighter and easier to carry. For example, the integration of a personal computer with a real-time video information system has permitted instant video communication through a network. Similarly, the integration of mobile phone with real-time video information system has permitted instant video communication through a wireless telephone network. Another example is the integration of audio and video sensors into a single unit.

In the past, the audio sensor and the video sensor are formed separately. FIG. 1 is a schematic cross-sectional view of a conventional video sensor. As shown in FIG. 1, a conventional video sensor 100 comprises a lens 102 on a lens mount 104, a holder 106, an infrared filter plate 108, an image-sensing chip 110, a passive component 112 and an image processor 114. The lens 102 receives light from an image, passes the light through the infrared filter plate 108 and finally focuses the light on the image-sensing chip 110. The image-sensing chip 110 transforms the received light into image signals. Thereafter, the image signals are transmitted through the peripheral circuits, for example, a passive device 112 into to the image processor 114 for further processing. In general, if the aforementioned image-sensing device is a complementary metal-oxide-semiconductor (CMOS) image-sensing module, the cost of producing the image sensor is lower and the overall size of the image sensor are smaller than a conventional charged couple device (CCD).

FIG. 2 is a schematic sectional view of a conventional audio sensor. As shown in FIG. 2, a conventional audio sensor comprises a polymer diaphragm 202, a spacer pad 204, a back plate 206, a media substance 208, an impedance converter 210 and a power source/peripheral circuit 212. In the past, carbon powder was inserted into the space between the polymer diaphragm 202 and the back plate 206. In recent years, the carbon powder has been replaced by air. When the diaphragm 202 receives any acoustic vibration, the carbon powder between two electrodes will be compressed or relaxed, therefore the impedance between the polymer diaphragm 202 and the back plate 206 is changed. The impedance is measured and converted by the impedance converter 210. The drawback of these kinds of products is their high noise content and relative instability.

Accordingly, the mechanical structure and the electronic circuits of a conventional image sensor and that of a conventional audio sensor are different. Hence, in most of the conventional audio/video sensing systems, the audio sensor and the video sensor are just assembled together for convenience. In the audio/video sensing system, the sensing device and circuits for audio sensing and image sensing are independent from each other. Therefore, a lot of space may be wasted and the cost is high. Furthermore, the images and sounds collected via the different sensing devices are not synchronous due to the compatibility of the sensing circuits. Thus, an integrated audio/video sensor is required.

SUMMARY OF THE INVENTION

Accordingly, one object of the present invention is to provide an integrated audio/video sensor that occupies a smaller space, costs less to produce and has the capability to synchronize collected video and audio signals.

To achieve these and other advantages and in accordance with the purpose of the invention, as embodied and broadly described herein, the invention provides an integrated audio/video sensor. The integrated audio/video sensor comprises an image-receiving module, a sound-receiving module and a signal-transforming module. The image-receiving module receives images. The sound-receiving module receives sound. The signal-transforming module receives the received images and the received sound and integrates the images and sound into an audio/video signals.

This invention also provides an integrated audio/video processing system comprising an integrated audio/video sensor and an audio/video system. The integrated audio/video sensor comprises an image-receiving module, a sound-receiving module and a signal-transforming module. The image-receiving module receives images. The sound-receiving module receives sound. The signal-transforming module receives the images and the sound and integrates the image and sound signals into audio/video signals. The audio/video system performs a post-processing of the audio/video signals.

In the aforementioned integrated audio/video sensor, the signal-transforming module further comprises an image-sensing chip, an audio amplifier, an audio/video processing chip and a peripheral chip. The image-sensing chip senses images and outputs the audio/video signals. The audio amplifier senses and amplifies sound and outputs the audio/video signals. The audio/video processing chip performs a post-processing of the audio/video signals. The peripheral circuit chip is a device for accommodates the circuits of other functional components.

In the aforementioned integrated audio/video sensor, the image-sensing chip can be a complementary metal-oxide-semiconductor (CMOS) image-sensing module or a charged coupled device (CCD).

In the aforementioned integrated audio/video sensor, the method of fabricating the signal-transforming module includes a multi-chip module (MCM) or a system on a chip (SOC) fabrication method.

In the aforementioned integrated audio/video sensor, the signal-transforming module has the capability to receive and synchronize image and sound simultaneously.

In the aforementioned integrated audio/video sensor, the audio/video signal comprises an image signal and an audio signal.

In the aforementioned integrated audio/video sensor, the sound-receiving module further comprises a condenser microphone.

In brief, this invention utilizes, for example, a multi-chip module (MCM) or a system on a chip (SOC) technology to integrate the image-sensing module, the sound-sensing module and the signal-transforming module together into an integrated audio/video sensor. With this arrangement, the space occupation can be significantly reduced and the fabrication cost of the sensor is greatly reduced. Furthermore, the compatibility between the video sensor and the audio sensor is resolved so that video and audio signals can be collected synchronously.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
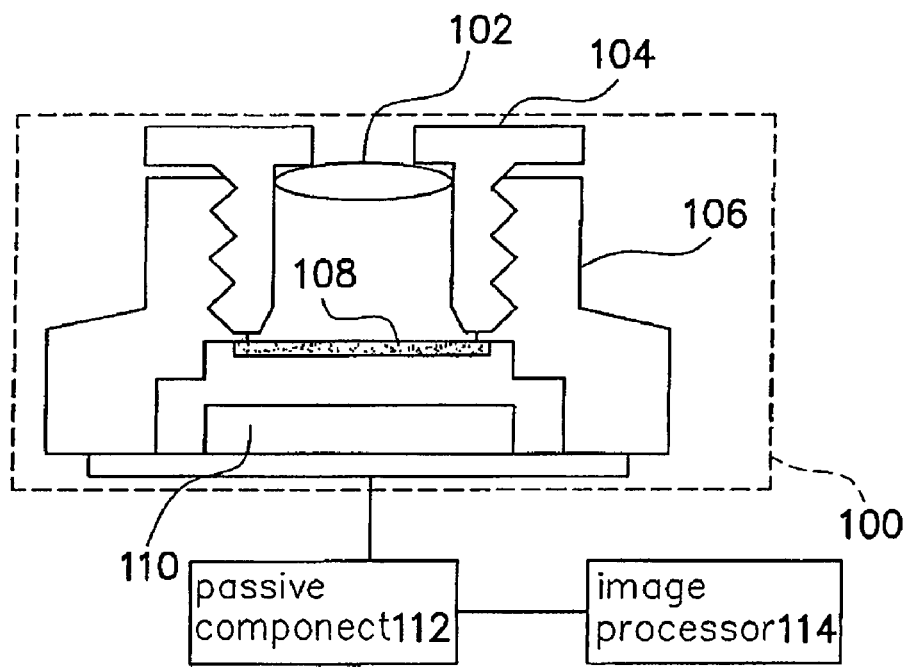
FIG. 1 is a schematic cross-sectional view of a conventional video sensor.
Figure 2:
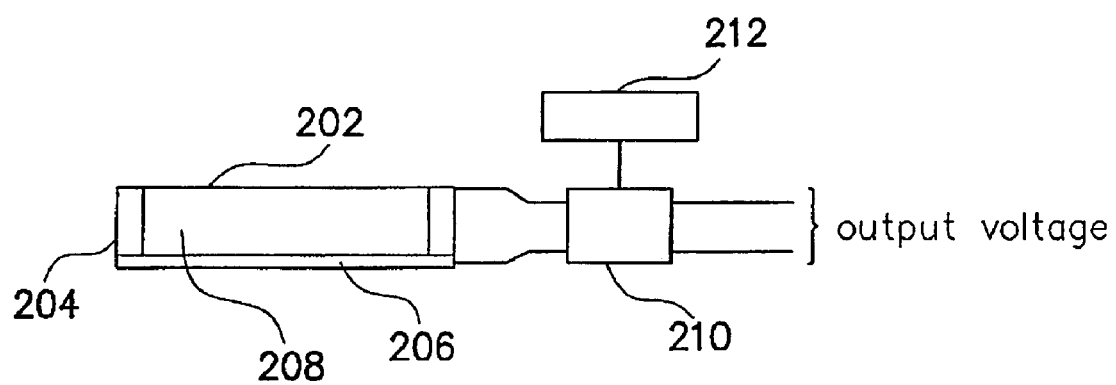
FIG. 2 is a schematic cross-sectional view of a conventional audio sensor.

Reference will now be made in detail to the present preferred embodiments of the invention, examples of which are illustrated in the accompanying drawings. Wherever possible, the same reference numbers are used in the drawings and the description to refer to the same or like parts.

Figure 3:
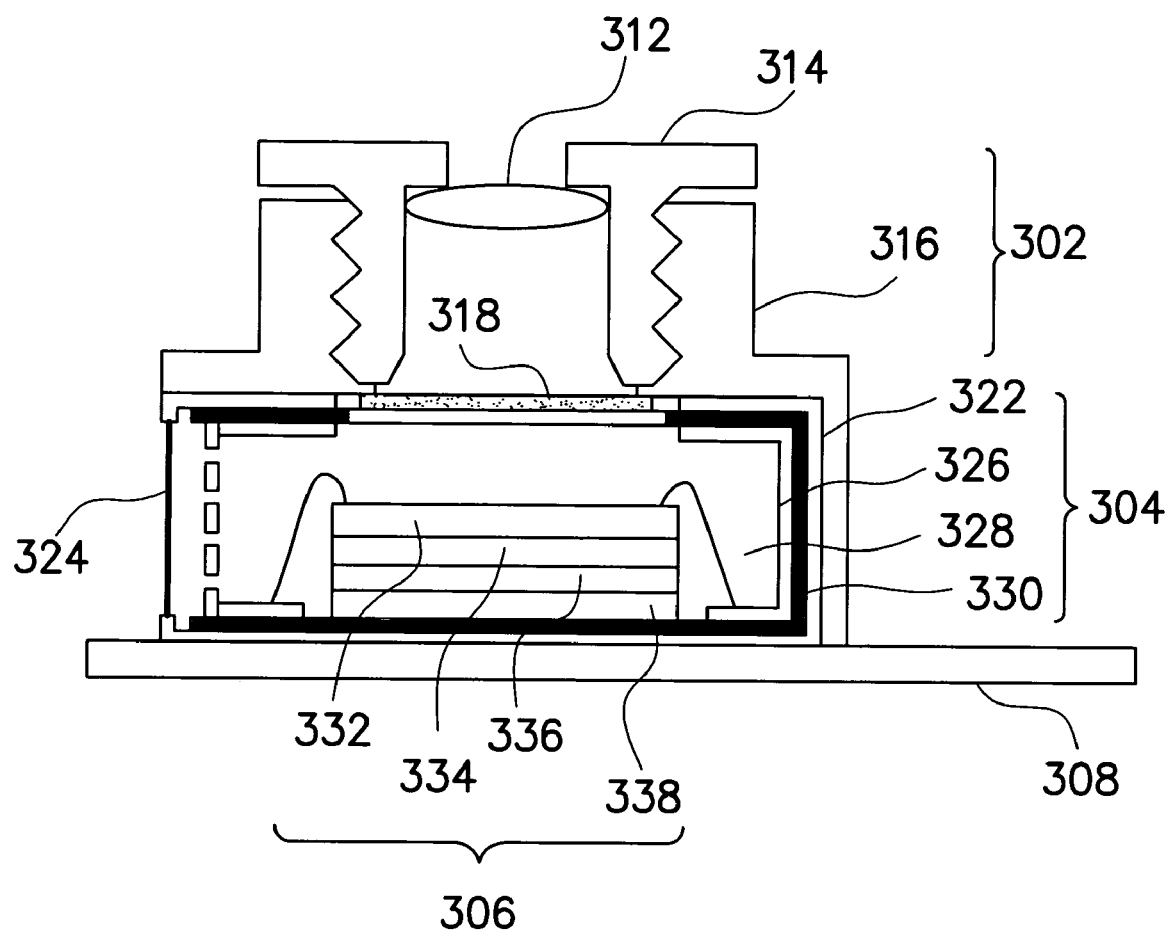
FIG. 3 is a schematic cross-sectional view of an integrated audio/video sensor according to one preferred embodiment of this invention.
Figure 4:
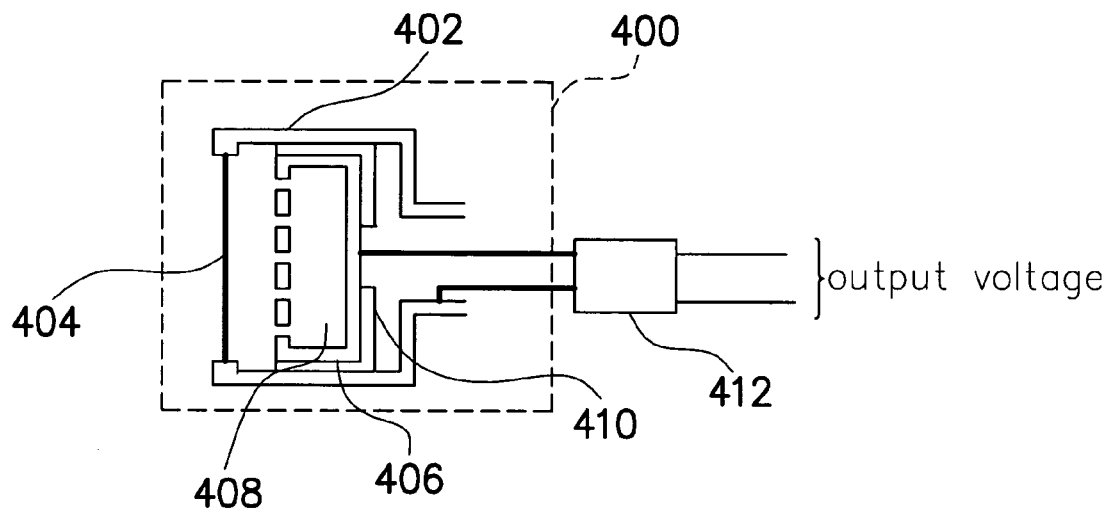
FIG. 4 is a schematic cross-sectional view illustrating the basic structure of a condenser microphone according to this invention.
Figure 5:
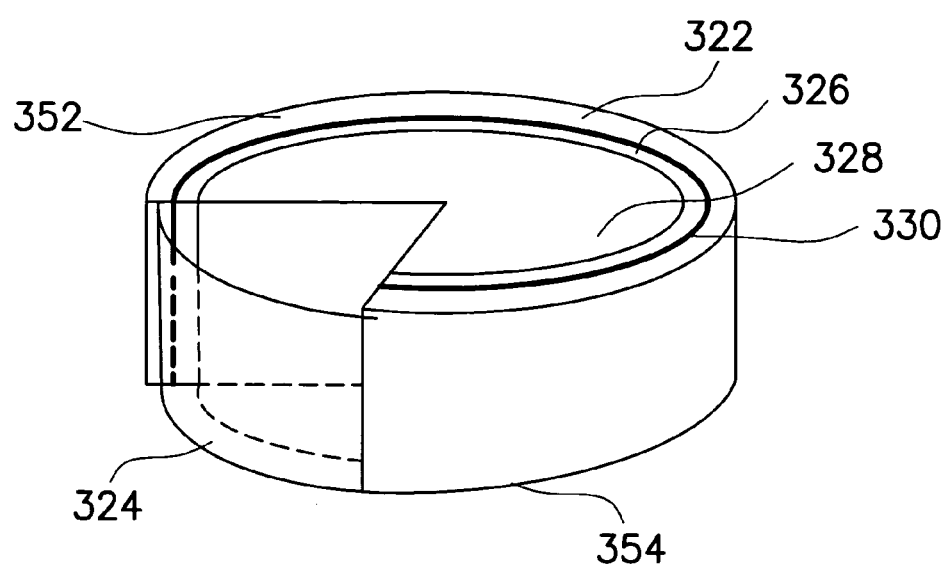
FIG. 5 is a partially perspective view illustrating the basic structure of a sound-sensing module according to this invention.

FIG. 3 is a schematic cross-sectional view of an integrated audio/video sensor according to one preferred embodiment of this invention. Referring to FIG. 3, an integrated audio/video sensor comprising an image sensor and a condenser microphone is shown. FIG. 4 is a schematic cross-sectional view illustrating the basic structure of a condenser microphone according to this invention. FIG. 5 is a partially perspective view illustrating the basic structure of a sound-sensing module according to this invention.

As shown in FIG. 4, the condenser microphone 400 comprises an outer cavity casing 402, a fixed inner cavity casing 406, an insulator 410 and an impedance converter 412. The outer cavity casing 402 has a membrane 404 thereon and the fixed inner cavity casing 406 has an air cavity 408 therein. The insulator 410 is disposed between the outer cavity casing 402 and the fixed inner cavity casing 406. The membrane 404 is a permanently charged electric material that provides a permanent polarized voltage. The membrane 404 combined with the fixed inner cavity casing 406 enclosing the air 408 constituting a capacitor. For this type of capacitor, the value of the capacitance can be estimated using a capacitor formula (1) that is approximate to a parallel plate capacitor:

$$C=Q/V=\epsilon_0 A/D \quad (1)$$

where C is the capacitance, Q is the amount of electric charges, V is the voltage between the membrane 404 and the fixed cavity casing 406, A is the area of the membrane 404, D is the distance between the membrane 404 and the fixed cavity casing 406, $\epsilon_0$ is the dielectric constant of the dielectric material. If the dielectric material is air, $\epsilon_0=1$. When sound waves are received by the membrane 404, the membrane 404 vibrates and causes the distance D to change. Through the variation of distance D with time, an inductive current I is produced according to formula (2) listed below:

$$I=dQ/dt=d(\epsilon_0 AV/D)/dt=\epsilon_0 AVd(1/d)/dt \quad (2),$$

where I is the inductive current, Q is the amount of electric charges, d(1/D)/dt is the variation of the inverted distance 1/D with time t. The inductive current I is electrically coupled to a field effect transistor (FET) converter so that the inductive current I is converted from a high impedance signal to a low impedance output signal. Alternatively, the inductive current I can be directly transferred to an audio amplifier for further processing. Since this type of condenser microphone has a very thin vibration membrane and directly output the voltage according to the acoustic pressure, the frequency response has a very broad and flat range. The actual frequency response may range from an ultra low frequency of a few Hz to a supersonic frequency of several tens of KHz. In other words, the condenser microphone has a high sensitivity, a low self-induced noise and a low signal distortion. However, one of the most important aspect is the incorporation of an air cavity 408 within the microphone, so that air serves as the dielectric medium instead of carbon powder in a conventional microphone. With air as a dielectric medium, the microphone can be easily integrated with an image sensor.

As shown in FIG. 3, an image sensor and a condenser microphone are integrated together to form an integrated audio/video sensor. The integrated audio/video sensor comprises an image-receiving module 302, a sound-receiving module 304 with a cavity 328, a signal-transforming module 306 and a substrate 308. The signal-transforming module 306 and the sound-receiving module 304 are disposed on the substrate 308, and the signal-transforming module 306 is accommodated in the cavity 328. The image-receiving module 302 is disposed on the sound-receiving module 304. The image-receiving module 302 further comprises a lens 312 on a lens mount 314, a holder 316 and an infrared filter plate 318. The sound-receiving module 304 further comprises an outer cavity casing 322 with a membrane 324 thereon, a fixed inner cavity casing 326 and an electrical insulator 330 between the outer cavity casing 322 and the fixed inner cavity casing 326. The signal-transforming module 306 further comprises an image-sensing chip 332, an audio/video processor chip 334, an audio amplifier chip 336 and a peripheral circuit chip 338.

Referring to FIG. 3, a light of an image is received by the lens 312 within the image-receiving module 302, and is transferred into the infrared filter plate 308. A portion of the light that has a wavelength in the range of or larger than an infrared is filtered by the infrared filter plate 308, and then the light is focused onto the image-sensing chip 332. Finally, the light of the image received by the image-sensing chip 332 is transformed into an image signal. In addition, the image signal can also be transmitted to the audio/video processor chip 334 for further processing. In this embodiment, the image-sensing chip includes, for example, but not limited to, a charged couple device (CCD) or a complementary metal-oxide-semiconductor (CMOS) image-sensing module.

The membrane 324 within the sound-receiving module 304 is a permanently charged electric material that provides a permanent electrode voltage. The membrane 324 and the fixed inner cavity 326 with an air cavity 328 constitute the two electrodes of a capacitor. If the air cavity 328 is filled with air, the dielectric constant is approximately 1. When sound waves are received by the membrane 324, the membrane 324 vibrates and the capacitance of the capacitor will change to generate a voltage variation and an inductive current. The output voltage or inductive current is transmitted into the audio amplifier for further processing and finally converted to an audio signal. The audio signal is transmitted into the audio/video processor chip 334 to perform the post-processing operations. Thus, the sound-receiving module 304 of this embodiment has some advantages of a condenser microphone. Furthermore, because the vibrating membrane is extremely thin, the voltage difference and the induced current generated from acoustic pressure can be output directly without a lot of noise similar to the prior art. Hence, the actual frequency response of the condenser microphone may range from an ultra low frequency of a few Hz to a supersonic frequency of several tens of KHz. In other words, the sound-receiving module has a high sensitivity, a low self-induced noise and a low signal distortion.

As shown in FIG. 5, the sound-receiving module includes, for example, but not limited to, an outer cavity casing 322, a membrane 324, a fixed inner cavity casing 326, an air cavity 328 and an electrical insulator 330. The electrical insulator 330 electrically isolates the outer cavity casing 322 from the fixed inner cavity casing 326. In general, a condenser microphone has a cylindrical shape with the membrane 324 located on an upper cross-sectional surface 352 or a lower cross-sectional surface 354 of the cylinder. In this invention, however, an image-receiving module 302 is installed on the upper surface 352 and a signal-transforming module 306 is installed on the lower surface 354. Therefore, the sound-receiving membrane 324 is set up on one side of the cylinder. Obviously, the setup between the membrane, the image-receiving module and the signal-transforming module is not limited to the embodiments described above. For example, the signal-transforming module 306 may be positioned between the upper and the lower surface of the cylinder so that the acoustic membrane can be set on the lower surface.

The image-sensing chip 332 inside the signal-transforming module 306 is used to detect and output video signals. The audio amplifier chip 336 is provided for detecting, amplifying and outputting audio signals. The audio/video processor chip 334 performs a post-processing of the image signals and the audio signals. The peripheral circuit chip 338 is a device for providing circuits to other functional components. The substrate 308 can be a flexible printed circuit (FPC), for example.

In this invention, a multi-chip module (MCM) or a system on a chip (SOC) technique can be provided to integrate all the chips 332, 334, 336 and 338 together on the substrate 308. After the integration, not only the signal-transforming module 306 is more compact, but also the compatibility issue between the image and audio sensor is resolved. Hence, both the image signal and the acoustic signals can be collected synchronously. If the substrate 308 is fabricated using a flexible printed circuit board, a space is much more compact.

Accordingly, this invention utilizes the multi-chip module (MCM) or the system on a chip (SOC) technique to integrate an image-sensing module, a sound-sensing module and a signal-transforming module together into an integrated audio/video sensor. Such integration not only saves a lot of space but also is able to synchronize the video and audio signals.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated audio/video sensor, comprising:
   a substrate;
   an image-receiving module for sensing an image;
   a sound-receiving module with a cavity, for sensing a sound, disposed on the substrate, wherein the image-receiving module is disposed on the sound-receiving module and comprises an outer cavity casing with a membrane thereon, a fixed inner cavity casing, and an electrical insulator between the outer cavity casing and the fixed inner cavity casing; and
   a signal-transforming module, disposed on the substrate and accommodated in the cavity, for transforming the received image and the received sound into an audio/video signal which comprises a video signal component and an audio signal component;
   wherein the signal-transforming module comprises an image-sensing chip for detecting the image and outputting the audio/video signal, an audio amplifier chip for detecting the sound, amplifying the sound detected and outputting the audio/video signal, and an audio/video processing chip for carrying out a post-processing of the audio/video signal.

2. The integrated audio/video sensor of claim 1, wherein the signal-transforming module further comprises:
   a peripheral circuit chip.

3. The integrated audio/video sensor of claim 2, wherein the image-sensing chip comprises a complementary metal-oxide-semiconductor (CMOS) image-sensing module or a charged coupled device (CCD).

4. The integrated audio/video sensor of claim 1, wherein the signal-transforming module is fabricated by a multi-chip module (MCM) method or a system on a chip (SOC) method.

5. The integrated audio/video sensor of claim 1, wherein the signal-transforming module transforms the received image and the received sound synchronously.

6. The integrated audio/video sensor of claim 1, wherein the sound-receiving module is a condenser microphone.

7. The integrated audio/video sensor of claim 1, wherein the image-receiving module comprises a holder and a lens installed in an end of the holder, and the sound-receiving module and the signal-transforming module are installed in an opposite end of the holder.

8. The integrated audio/video sensor of claim 7, wherein the cavity is an air cavity.

9. An integrated audio/video signal processing system, comprising:
   an integrated audio/video sensor, comprising:
      a substrate;
      a sound-receiving module with a cavity, for sensing a sound, disposed on the substrate, wherein the image-receiving module is disposed on the sound-receiving module and comprises an outer cavity casing with a membrane thereon, a fixed inner cavity casing, and an electrical insulator between the outer cavity casing and the fixed inner cavity casing; and a signal-transforming module, disposed on the substrate and accommodated in the cavity, for transforming the received image and the received sound into an audio/video signal, wherein the signal-transforming module comprises an image-sensing chip for detecting the image and outputting the audio/video signal, an audio amplifier chip for detecting the sound, amplifying the sound detected and outputting the audio/video signal, and an audio/video processing chip for carrying out a post-processing of the audio/video signal; and an audio/video system for post-processing the audio/video signal.

10. The integrated audio/video signal processing system of claim 9, wherein the signal-transforming module further comprises:

a peripheral circuit chip.

11. The integrated audio/video signal processing system of claim 10, wherein the image-sensing chip further comprises a complementary metal-oxide-semiconductor (CMOS) image-sensing module or a charged coupled device (CCD).

12. The integrated audio/video signal processing system of claim 9, wherein the signal-transforming module is fabricated using either a multi-chip module (MCM) method or a system on a chip (SOC) method.

13. The integrated audio/video signal processing system of claim 9, wherein the signal-transforming module transforms the received image and the received sound synchronously.

14. The integrated audio/video signal processing system of claim 9, wherein the audio/video signal comprises a video signal component and an audio signal component.

15. The integrated audio/video signal processing system of claim 9, wherein the sound-receiving module is a condenser microphone.

16. The integrated audio/video signal processing system of claim 9, wherein the image-receiving module comprises a holder and a lens installed in an end of the holder, and the sound-receiving module and the signal-transforming module are installed in an opposite end of the holder.

17. The integrated audio/video signal processing system of claim 16, wherein the cavity is an air cavity.

* * * * *